(12) United States Patent
Bae et al.

(10) Patent No.: US 10,396,099 B2
(45) Date of Patent: Aug. 27, 2019

(54) COPLANAR TYPE OXIDE THIN FILM TRANSISTOR, METHOD OF MANUFACTURING THE SAME, AND DISPLAY PANEL AND DISPLAY DEVICE USING THE SAME

(71) Applicant: LG Display Co., Ltd., Seoul (KR)

(72) Inventors: JongUk Bae, Seoul (KR); YongHo Jang, Goyang-si (KR); JunHyeon Bae, Goyang-si (KR); Kwanghwan Ji, Taebaek-si (KR); PilSang Yun, Bucheon-si (KR); Jiyong Noh, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 15/391,636

(22) Filed: Dec. 27, 2016

(65) Prior Publication Data

US 2018/0006056 A1     Jan. 4, 2018

(30) Foreign Application Priority Data

Jun. 30, 2016    (KR) .......................... 10-2016-0083097

(51) Int. Cl.
*H01L 27/12* (2006.01)
*G02F 1/1368* (2006.01)
(Continued)

(52) U.S. Cl.
CPC .......... *H01L 27/124* (2013.01); *G02F 1/1368* (2013.01); *G02F 1/136209* (2013.01);
(Continued)

(58) Field of Classification Search
CPC ............... H01L 27/124; H01L 27/3272; H01L 29/7869; G02F 1/136209; G02F 1/136286;
(Continued)

(56) References Cited

U.S. PATENT DOCUMENTS 9,647,009 B1     5/2017  Zhao et al.
10,141,444 B2    11/2018 Wang et al.
(Continued)

FOREIGN PATENT DOCUMENTS

CN     104900531 A     9/2015
CN     105679765 A     6/2016
(Continued)

OTHER PUBLICATIONS

European Patent Office, Communication pursuant to Article 94(3) EPC, EP Patent Application No. 16207507.1, Jun. 4, 2019, five pages.

*Primary Examiner* — Tong-Ho Kim
(74) *Attorney, Agent, or Firm* — Fenwick & West LLP (57) ABSTRACT

Disclosed are an oxide thin film transistor (TFT), a method of manufacturing the same, and a display panel and a display device using the same, in which a first conductor and a second conductor are provided at end portions of a semiconductor layer formed of oxide semiconductor. The first conductor and second conductor are electrically connected to a first electrode and a second electrode, and covered by a gate insulation layer. The oxide TFT includes a semiconductor layer provided on a buffer and including an oxide semiconductor, a gate insulation layer covering the semiconductor layer and the buffer, a gate electrode provided on the gate insulation layer to overlap a portion of the semiconductor layer, and a passivation layer covering the gate and the gate insulation layer.

17 Claims, 7 Drawing Sheets

(51) Int. Cl.
*H01L 27/32* (2006.01)
*G02F 1/1362* (2006.01)
*H01L 29/786* (2006.01)
*G09G 3/36* (2006.01)
*G09G 3/3266* (2016.01)
*G09G 3/3258* (2016.01)
*G09G 3/3275* (2016.01)
*H01L 29/417* (2006.01)
*H01L 29/66* (2006.01)

(52) U.S. Cl.
CPC .... *G02F 1/136286* (2013.01); *H01L 27/3272* (2013.01); *H01L 29/41733* (2013.01); *H01L 29/66969* (2013.01); *H01L 29/7869* (2013.01); *H01L 29/78618* (2013.01); *G09G 3/3258* (2013.01); *G09G 3/3266* (2013.01); *G09G 3/3275* (2013.01); *G09G 3/3677* (2013.01); *G09G 3/3688* (2013.01); *G09G 2300/0426* (2013.01); *G09G 2310/0291* (2013.01); *G09G 2310/08* (2013.01)

(58) Field of Classification Search
CPC .. G02F 1/1368; G09G 3/3258; G09G 3/3266; G09G 3/3275; G09G 3/3677; G09G 3/3688; G09G 2300/0426; G09G 2310/0291; G09G 2310/08

USPC .......................................................... 257/43
See application file for complete search history.

(56) References Cited

U.S. PATENT DOCUMENTS

| | | | |
|---|---|---|---|
| 2005/0087742 | A1 | 4/2005 | Chang et al. |
| 2011/0084272 | A1* | 4/2011 | Miyanaga ............... H01L 29/45 257/43 |
| 2012/0069259 | A1 | 3/2012 | Oh et al. |
| 2012/0161126 | A1* | 6/2012 | Yamazaki ......... H01L 27/10873 257/43 |
| 2013/0280858 | A1* | 10/2013 | Kimura ............... H01L 27/1225 438/104 |
| 2014/0120658 | A1* | 5/2014 | Yang .................. H01L 29/7869 438/104 |
| 2015/0069336 | A1 | 3/2015 | Okumura et al. |
| 2015/0129870 | A1 | 5/2015 | Hsin et al. |
| 2017/0092772 | A1* | 3/2017 | Seo .................. H01L 21/02554 |

FOREIGN PATENT DOCUMENTS

| | | |
|---|---|---|
| JP | 2010199456 A | 9/2010 |
| KR | 20050038850 A | 4/2005 |
| KR | 20050068844 A | 7/2005 |
| KR | 20140056696 A | 5/2014 |
| KR | 20160049172 A | 5/2016 |

* cited by examiner

COPLANAR TYPE OXIDE THIN FILM TRANSISTOR, METHOD OF MANUFACTURING THE SAME, AND DISPLAY PANEL AND DISPLAY DEVICE USING THE SAME

CROSS-REFERENCE TO RELATED APPLICATIONS

This application claims the benefit of Republic of Korea Patent Application No. 10-2016-0083097 filed on Jun. 30, 2016, which is hereby incorporated by reference as if fully set forth herein.

BACKGROUND

Field of the Invention

The present invention relates to a coplanar type oxide thin film transistor (TFT), a method of manufacturing the same, and a display panel and a display device using the same.

Discussion of the Related Art

A flat panel display (FPD) device is applied to various electronic devices such as portable phones, tablet personal computers (PCs), notebook computers, monitors, etc. Examples of FPD apparatuses include liquid crystal display (LCD) devices, plasma display panel (PDP) devices, organic light emitting display devices, etc. Recently, electrophoretic display (EPD) devices are being widely used as one type of the FPD device.

In FPD devices, LCD devices display an image by using liquid crystal, and organic light emitting display devices use a self-emitting device that self-emits light.

A display panel configuring a display device includes a plurality of switching elements, for displaying an image. The switching elements may be configured with thin film transistors (TFTs). Each of the TFTs may be formed of amorphous silicon (a-Si), poly silicon, or oxide. A TFT formed of oxide is referred to as an oxide TFT.

Figure 1:
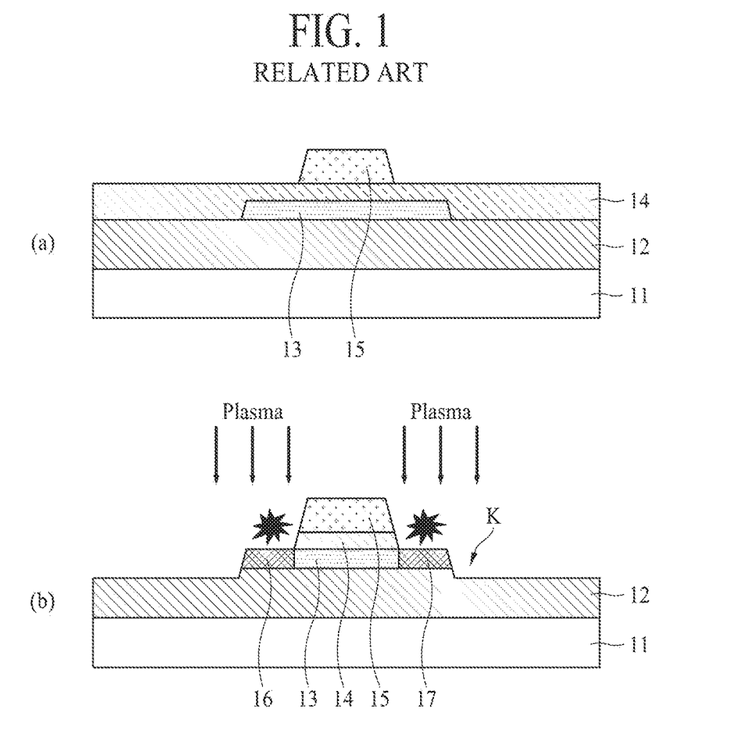
FIG. 1 is an exemplary diagram illustrating a process of manufacturing a related art coplanar type oxide TFT.

FIG. 1 is an exemplary diagram illustrating a process of manufacturing a related art coplanar type oxide TFT.

First, as illustrated in FIG. 1 (a), a buffer 12 is coated on a substrate 11, an oxide semiconductor 13 is coated on an upper side of the buffer 12, a gate insulation layer 14 is coated on the oxide semiconductor 13, and a patterned gate 15 is stacked on an upper side of the gate insulation layer 14. When the gate insulation layer 14 is etched by using the gate 15 as a mask, as illustrated in FIG. 1 (b), a portion of the oxide semiconductor 13 is exposed.

In this case, as illustrated in FIG. 1 (b), when plasma is irradiated onto the exposed portion of the oxide semiconductor 13, the exposed area becomes conductive, and thus, a first electrode 16 and a second electrode 17 of the oxide TFT are formed. One of the first electrode 16 and the second electrode 17 is a source of the oxide TFT, and the other electrode is a drain of the oxide TFT.

As described above, the gate insulation layer 14 is etched through a dry etching process, and then, the exposed portion of the oxide semiconductor 13 becomes conductive by plasma treatment, thereby manufacturing the first electrode 16 and the second electrode 17 of the related art coplanar type oxide TFT.

However, since the gate insulation layer 14 is etched through a dry etching process for forming the first electrode 16 and the second electrode 17, the buffer 12 is etched in the dry etching process, and for this reason, a step height K can occur between the oxide semiconductor 13a and the buffer 12. Due to the step height K, a short circuit defect can occur in lines connected between the first electrode 17 and the second electrode 16.

Moreover, in depositing an insulation layer in a subsequent process, due to the step height K, step coverage problems can occur, and the gate 15 and the drain may be short-circuited with each other, causing a short circuit defect. For this reason, the reliability of a TFT is degraded.

Moreover, when the gate insulation layer 14 is over-etched, a portion of the buffer 12 may be damaged or removed.

In addition, if a light shielding layer for blocking light is provided between the substrate 11 and the buffer 12, and the gate insulation layer 14 and the buffer 12 are over-etched, the light shielding layer can be exposed or the thickness of the buffer 12 may be reduced, causing a short circuit between the light shielding layer and the gate 15.

Thus, in order to manufacture the related art coplanar type oxide TFT, the gate insulation layer 14 should be etched through the dry etching process, and due to the dry etching process, various kinds of defects can occur.

SUMMARY

Accordingly, the present disclosure is directed to provide a coplanar type oxide thin film transistor (TFT), a method of manufacturing the same, and a display panel and a display device using the same that substantially obviate one or more problems due to limitations and disadvantages of the related art.

An aspect of the present disclosure is directed to provide a coplanar type oxide TFT, a method of manufacturing the same, and a display panel and a display device using the same, in which a first conductor and a second conductor are provided at end portions of a semiconductor layer formed of oxide semiconductor, electrically connected to a first electrode and a second electrode, and covered by a gate insulation layer.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a coplanar type oxide TFT including a semiconductor layer provided on a buffer, the semiconductor layer including an oxide semiconductor, a gate insulation layer covering the semiconductor layer and the buffer, a gate provided on the gate insulation layer to overlap a portion of the semiconductor layer, and a passivation layer covering the gate and the gate insulation layer, wherein a resistance of an area of the semiconductor layer overlapping the gate differs from a resistance of an area other than the overlapping area.

In another aspect of the present disclosure, there is provided a method of manufacturing a coplanar type oxide thin film transistor (TFT) including depositing a buffer on a substrate, forming a semiconductor layer including an oxide semiconductor in the buffer, depositing a gate insulation layer to cover the semiconductor layer and the buffer, depositing a gate, overlapping a portion of the semiconductor layer, on the gate insulation layer, and irradiating ultraviolent (UV) to cause an area of the semiconductor layer, which does not overlap the gate, to become conductive.

Embodiments relate to an oxide TFT including a semiconductor layer provided on a buffer. The semiconductor layer includes an oxide semiconductor material, and includes an active area, a first conductor adjacent to a first end of the active area, and a second conductor adjacent to a second end of the active area. The oxide TFT also includes a gate insulation layer covering the semiconductor layer and the buffer, a gate electrode provided on the gate insulation layer and overlapping a portion of the semiconductor layer, and a passivation layer covering the gate electrode and the gate insulation layer. A resistance of the active area is different from a resistance of the first conductor and a resistance of the second conductor.

Embodiments also relate to a display panel comprising a plurality of gate lines that receive a plurality of gate pulses, a plurality of data lines that receive a plurality of data voltages, and a plurality of pixels defined by the plurality of gate lines and the plurality of data lines. Each of the plurality of pixels includes an oxide TFT including a semiconductor layer provided on a buffer, in which the semiconductor layer includes an oxide semiconductor material, and includes an active area, a first conductor adjacent to a first end of the active area, and a second conductor adjacent to a second end of the active area. The oxide TFT also includes a gate insulation layer covering the semiconductor layer and the buffer, a gate electrode provided on the gate insulation layer and overlapping a portion of the semiconductor layer, a passivation layer covering the gate electrode and the gate insulation layer. A resistance of the active area is different from a resistance of the first conductor and a resistance of the second conductor.

Embodiments also relate to a method of manufacturing an oxide TFT. A buffer is deposited on a substrate. A semiconductor layer including an oxide semiconductor material is formed on the buffer. A gate insulation layer is deposited to cover the semiconductor layer and the buffer, and a gate electrode is deposited on the gate insulation layer. A resistance of a first area of the semiconductor layer adjacent to a first end of an active area of the semiconductor layer and a second area of the semiconductor layer adjacent to a second end of the active area is decreased. The first area with the decreased resistance forms a first conductor and the second area with the decreased resistance forms a second conductor while the gate insulation layer is covering the semiconductor layer and the buffer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Furthermore, the present invention is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present disclosure will be described in detail with reference to the accompanying drawings.

Figure 2:
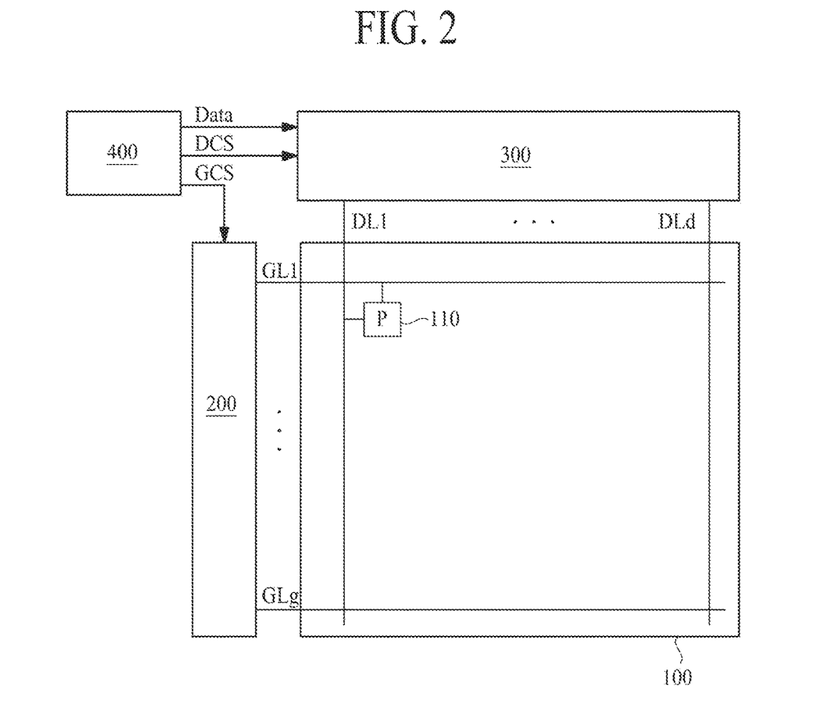
FIG. 2 is an exemplary diagram illustrating a configuration of a display device according to an embodiment of the present disclosure.

FIG. 2 is an exemplary diagram illustrating a configuration of a display device according to an embodiment of the present disclosure.

As illustrated in FIG. 2, the display device according to an embodiment of the present disclosure may include a display panel 100 where a plurality of pixels (P) 110 defined by a plurality of gate lines GL1 to GLg and a plurality of data lines DL1 to DLd are provided to display an image. The display device may also include a gate driver 200 that sequentially supplies a gate pulse to the gate lines GL1 to GLg included in the panel 100, a data driver 300 that respectively supplies data voltages to the data lines DL1 to DLd included in the panel 100, and a controller 400 that controls the gate driver 200 and the data driver 300.

The display panel 100 may include the gate lines GL1 to GLg supplied with the gate pulse, the data lines DL1 to DLd supplied with the data voltages, and the pixels 110 defined by the gate lines GL1 to GLg and the data lines DL1 to DLd. The pixels 110 may each include at least one coplanar type oxide TFT (hereinafter simply referred to as an "oxide TFT") according to an embodiment of the present disclosure. A configuration and a function of the oxide TFT will be described in detail with reference to FIGS. 3 to 12.

The display panel 100 may be a liquid crystal display panel applied to LCD devices, or may be an organic light emitting display panel applied to organic light emitting display devices.

If the display panel 100 is a liquid crystal display panel, each of the pixels 110 included in the display panel 100 may include one oxide TFT used as a switching element for driving the liquid crystals.

If the display panel 100 is an organic light emitting display panel, each of the pixels 110 included in the display panel 100 may include an organic light emitting diode (OLED) emitting light and a pixel driver for driving the OLED.

The pixel driver may be configured with two or more TFTs for driving the OLED.

The TFTs included in the pixel driver may be oxide TFTs. However, the oxide TFTs may also be provided in a non-display area outside the display area where the pixels 110 are provided. Therefore, all TFTs included in the display panel 100 may be formed through the same process.

For example, if the gate driver 200 is built into the non-display area of the display panel 100, TFTs configuring the gate driver 200 may each be configured as an oxide TFT.

The controller 400 may generate and output a gate control signal GCS for controlling the gate driver 200 and a data control signal DCS for controlling the data driver 300 by using a vertical synchronization signal, a horizontal synchronization signal, and a clock which are supplied from an external system.

Moreover, the controller 400 may sample input video data received from the external system, realign the sampled video data to generate digital image data Data, and supply the digital image data to the data driver 300.

The data driver 300 may convert the image data Data input from the controller 400 into analog data voltages and may respectively supply the data voltages for one horizontal line to the data lines DL1 to DLd at every one horizontal period where the gate pulse is supplied to one gate line GL.

The gate driver 200 may sequentially supply the gate pulse to the gate lines GL1 to GLg in response to the gate control signal GCS input from the controller 400. Therefore, oxide TFTs provided in each of pixels to which the gate pulse is input may be turned on, and thus, each of the pixels 110 may display an image.

The gate driver 200 may be provided independently from the panel 100 and may be electrically connected to the panel 100 in various ways. For example, the gate driver 200 may be provided in a gate-in panel (GIP) type which is mounted in the non-display area of the display panel 100.

Figure 3:
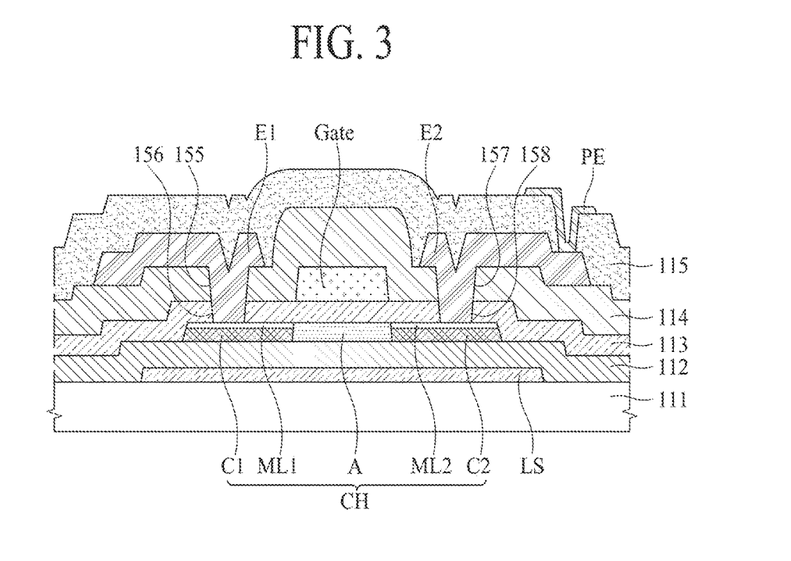
FIG. 3 is a cross-sectional view of a coplanar type oxide TFT according to an embodiment of the present disclosure.

FIG. 3 is a cross-sectional view of a coplanar type oxide TFT according to an embodiment of the present disclosure.

The display device according to an embodiment of the present disclosure, as described above, may include the display panel 100, and at least one coplanar type oxide TFT according to an embodiment of the present disclosure, like as illustrated in FIG. 3, may be included in each of the plurality of pixels provided in the display area of the display panel 100.

The oxide TFT according to an embodiment of the present disclosure, as illustrated in FIG. 3, may include a semiconductor layer CH formed of oxide semiconductor material provided on a buffer 112 deposited on a substrate 111, a gate insulation layer 113 which covers the semiconductor layer CH and the buffer 112, a gate electrode Gate which is provided on the gate insulation layer 113 and overlaps at least a portion of the semiconductor layer CH, and a passivation layer 114 that covers the gate electrode Gate and the gate insulation layer 113. In this case, a resistance of an area of the semiconductor layer CH overlapping the gate electrode Gate may differ from a resistance of an area outside the overlapping area. As illustrated in FIG. 3, a TFT having a type where the gate is disposed on the semiconductor layer CH may be referred to as a coplanar type TFT.

The buffer 112 may be disposed on the substrate 111. The buffer 112 may be formed of an organic material or an inorganic material, formed of a combination thereof, and formed of at least one layer. For example, the buffer 12 may include SiO$_2$, and a thickness of the buffer 112 may be adjusted to 100 nm to 1 μm.

As illustrated in FIG. 3, a light shielding layer LS for blocking light incident on the semiconductor layer CH may be further provided between the substrate 111 and the buffer 112. As shown in FIG. 3, an end of the light shielding layer LS may have an inclined surface from the top surface of the light shielding layer LS to the bottom surface of the light shielding layer LS. In such an instance, the buffer 112 may be deposited along the inclined surface of the light shielding layer LS with a uniform thickness such that the buffer 112 also has an inclined surface. The gate insulation layer 113 may also cover the portion of the buffer 112 having the inclined surface.

In an embodiment of the present disclosure, the gate insulation layer 113 may not be etched, and thus, the buffer 112 may not be damaged by an etching process. For example, without the portion of the gate insulation layer 113 covering the buffer 112, an etching process for etching the gate insulation layer 113 may also damage or etch a portion of the buffer 112 covering the light shielding layer LS, including the inclined surface of the buffer 112. This can result in a short circuit between the gate electrode Gate and the light shielding layer LS. Since the gate insulation layer 113 is not etched, the gate insulation layer 113 can cover the buffer 112 such that a short circuit between the gate electrode Gate and the light shielding layer LS can be prevented.

Since the buffer 112 is not damaged or removed, defects occurring in subsequent processes are reduced.

The semiconductor layer CH may be formed of an oxide semiconductor. For example, the oxide semiconductor may be indium-gallium zinc oxide (IGZO) consisting of indium (In), gallium (Ga), zinc (Zn), and oxygen (O). In addition, the oxide semiconductor may include tin (Sn), hafnium (Hf), magnesium (Mg), aluminum (Al), or zirconium (Zr).

The semiconductor layer CH may include an active area A formed of the oxide semiconductor, a first conductor C1 which is provided adjacent to one end of the active area A in the semiconductor layer CH and has a sheet resistance lower than that of the active area A, and a second conductor C2 which is provided adjacent to the other end of the active area A in the semiconductor layer CH and has a sheet resistance lower than that of the active area A. The active area A may be aligned with the gate electrode Gate, or may be aligned with the light shielding layer LS disposed below the buffer 112. That is a width of the active area A is aligned with a width of the gate electrode Gate in one embodiment and in another embodiment the width of the active area A is aligned with the width of the light shielding layer LS.

The first conductor C1 may be connected to a first electrode E1, and the second conductor C2 may be connected to a second electrode E2.

If the oxide TFT is a TFT provided in each pixel of a liquid crystal display panel, the first electrode E1 may be connected to a data line, and the second electrode E2 may be connected to a pixel electrode PE included in the pixel. In this case, the gate electrode Gate may be connected to a gate line.

The first conductor C1 may include metal that is included in the oxide semiconductor, and the metal included in the first conductor C1 may have free electrons and a vacancy from which oxygen is separated. Also, the second conductor C2 may include a metal included in the oxide semiconductor, and the metal included in the second conductor C2 may have free electrons and a vacancy from which oxygen is separated.

For example, when UV is irradiated onto the oxide semiconductor having covalently bonded compounds of metal and oxygen, the covalent bond between the metal and the oxygen may be broken and oxygen vacancies may be created. Accordingly, free electrons may be generated in the metal.

An area where the free electron is generated through exposure to UV radiation may be the first conductor C1 and/or the second conductor C2. Due to the free electrons generated in the first conductor C1 and/or the second conductor C2, mobility of each of the first conductor C1 and the second conductor C2 may be greater than mobility of the active area A consisting of the oxide semiconductor. Also, due to the free electrons generated in the first conductor C1 and/or the second conductor C2, resistance of each of the first conductor C1 and the second conductor C2 may be smaller than the resistance of the active area A consisting of the oxide semiconductor.

Therefore, the first conductor C1 and the second conductor C2 may have characteristics of a conductor. As described above, the first conductor C1 may be electrically connected to the first electrode E1, and the second conductor C2 may be electrically connected to the second electrode E2.

At the boundary area between the first conductor C1 and the gate insulation layer 113, metal included in the oxide semiconductor may be bonded to a hydroxy group (—OH) from the gate insulation layer 113 to form a first metal layer ML1 that contacts the gate insulation layer 113. Also, at the boundary area between the second conductor C2 and the gate insulation layer 113, metal included in the oxide semiconductor may be bonded to a hydroxyl group (—OH) from the gate insulation layer 113 to generate a second metal layer ML2 that contacts the gate insulation layer 113.

The gate insulation layer 113 may include SiO$_2$. The gate electrode Gate may be provided on the gate insulation layer 113. The gate electrode Gate may overlap the active area A consisting of the oxide semiconductor in the semiconductor layer CH.

In this case, the first conductor C1 and the second conductor C2 may not overlap the gate electrode Gate.

For example, the gate insulation layer 113 may be provided on the semiconductor layer CH, and the gate electrode Gate may be provided on the gate insulation layer 113. Subsequently, when the UV is irradiated onto an upper side of each of the gate electrode Gate and the gate insulation layer 113, as described above, both ends of the active area A may not be covered by the gate electrode Gate consisting of metal, and for this reason, the UV may be irradiated onto both ends of the active area A via the gate insulation layer 113. Therefore, the active area A may be aligned with the gate electrode Gate, and both ends of the active area A may become conductive, and thus, the first and second conductors C1 and C2 may be formed. Alternatively when the UV light is irradiated from below the substrate, the active area A may be aligned with the light shielding layer LS, and both ends of the active area A may become conductive to form the first and second conductors C1 and C2.

The passivation layer 114 that covers the gate electrode Gate and the gate insulation layer 113 may be provided on the gate electrode Gate and the gate insulation layer 113.

The passivation layer 114 may include SiO$_2$.

Surface treatment may be performed before the passivation layer 114 is deposited, and thus, an oxygen concentration at a surface portion of the oxide semiconductor constituting the semiconductor layer CH may vary from 1% to 5%.

The first electrode E1 provided on the passivation layer 114 may be connected to the first conductor C1 through a first contact hole formed in the passivation layer 114 and a second contact hole formed in the gate insulation layer 113 that is aligned with the first contact hole, and the second electrode E2 may be connected to the second conductor C2 through a third contact hole formed in the passivation layer 114 and a fourth contact hole formed in the gate insulation layer 113 that is aligned with the third contact hole.

The passivation layer 114, the first electrode E1, and the second electrode E2 may be covered by an insulation layer 115.

An electrode layer which is connected to the second electrode E2 through a contact hole formed in the insulation layer 115 may be formed on the insulation layer 115. The electrode layer, as described above, may be a pixel electrode PE.

FIGS. 4 to 7 are exemplary diagrams illustrating a method of manufacturing a coplanar type oxide TFT according to an embodiment of the present disclosure. FIG. 8 is an exemplary diagram illustrating another coplanar type oxide TFT applied to an organic light emitting display panel according to an embodiment of the present invention. Hereinafter, details which are the same as or similar to the details described above with reference to FIG. 3 are omitted or will be briefly described.

Figure 4:
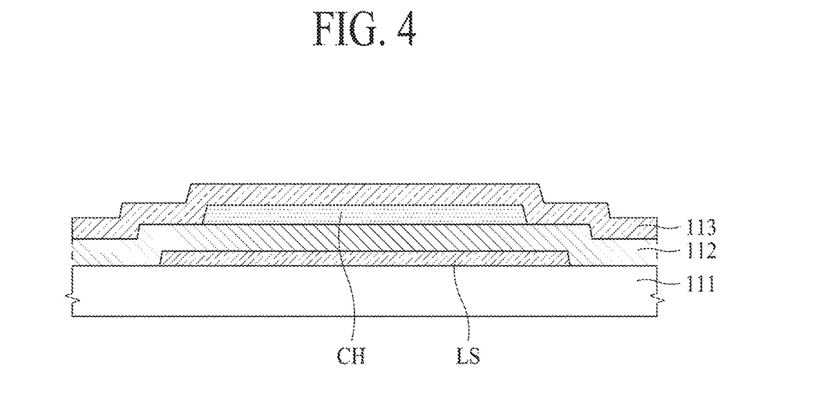
FIGS. 4 to 7 are exemplary diagrams illustrating a method of manufacturing a coplanar type oxide TFT according to an embodiment of the present disclosure.

First, as illustrated in FIG. 4, the light shielding layer LS, the buffer 112, the semiconductor layer CH, and the gate insulation layer 113 may be sequentially stacked on the substrate 111. The light shielding layer LS may be formed such that an end of the light shielding layer LS has an inclined surface. In such an instance, the buffer 112 may be deposited along the light shielding layer LS with uniform thickness such that a portion of the buffer 112 also has an inclined surface. The gate insulation layer 113 may cover the portion of the buffer 112 having the inclined surface.

Alternatively, the light shielding layer LS may be omitted.

All areas of the semiconductor layer CH may consist of an oxide semiconductor such as IGZO or the like.

Figure 5:
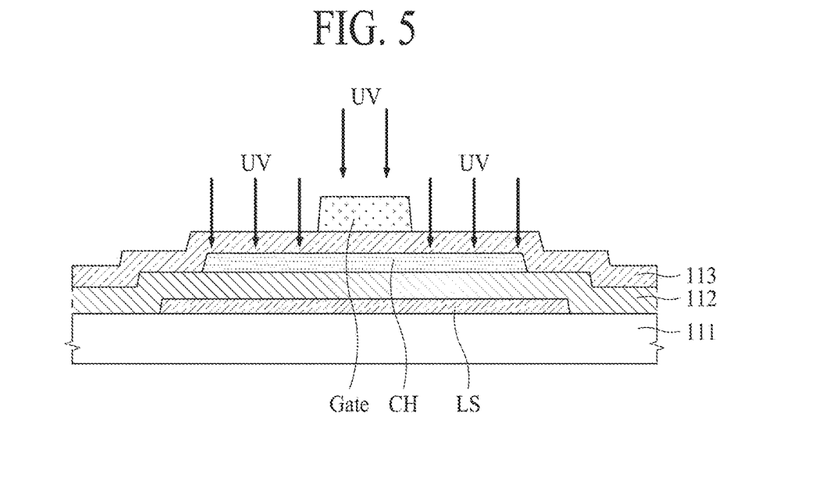

Subsequently, as illustrated in FIG. 5, the gate electrode Gate may be coated on an area corresponding to the semiconductor layer CH. In this case, the gate electrode Gate may overlap with a center portion of the semiconductor layer CH without overlapping the whole semiconductor layer CH. Therefore, both ends of the semiconductor layer CH may not overlap the gate electrode Gate.

The gate electrode Gate may be provided, and then, the UV may be irradiated onto the gate electrode Gate and the gate insulation layer 113. In this case, as illustrated in FIG. 5, the UV may be irradiated onto an upper side of each of the gate insulation layer 113 and the gate electrode Gate. Thus, a resistance of a first area of the semiconductor layer CH that does not overlap the gate electrode Gate is decreased to form the first conductor C1, and a resistance of a second area of the semiconductor layer CH at the opposite end of the first area that does not overlap with the gate electrode Gate is decreased to form the second conductor C2. Thus, the active area A is formed in between the first conductor C1 and the second conductor C2, and is aligned with the gate electrode Gate, and the first conductor C1 is formed adjacent to a first end of the active area A, and the second conductor C2 is formed adjacent to a second area of the active area A.

However, the UV, as illustrated in FIG. 8, may be irradiated from below the substrate 111. For example, in a case where the light shielding layer LS is formed smaller than the semiconductor layer CH, and particularly, formed in a size similar to that of the gate electrode Gate, areas of the semiconductor layer CH which is not covered by the light shielding layer LS may become conductive when the UV is irradiated through the lower side of the substrate 111, thereby forming the first conductor C1 and the second conductor C2. In such an instance, the active area A may be formed in between the first conductor C1 and the second conductor C2 to be aligned with the light shielding layer LS. In this case, the light shield LS may be formed greater or less than the gate Gate. Particularly, the light shield LS may be formed to have the same size as that of the gate Gate and may be disposed to overlap the gate Gate.

The UV irradiation may include UV rays having a wavelength 185 nm and UV rays having a wavelength of 254 nm. The oxide semiconductor may become conductive by the UV, and thus, the first conductor C1 and the second conductor C2 may be formed.

A wavelength of the UV rays may be within a range from 100 nm to 400 nm.

Figure 6:
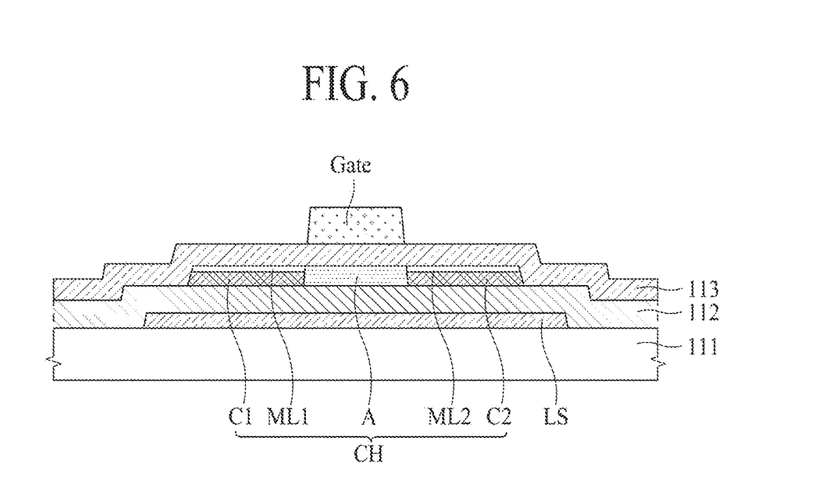

In this case, when thermal processing of about 100° C. to about 200° C. is applied along with the UV irradiation or after the UV is irradiated, the first metal layer ML1 may be formed in a boundary area between the first conductor C1 and the gate insulation layer 113 to contact the gate insulation layer 113, and the second metal layer ML2 may be formed in a boundary area between the second conductor C2 and the gate insulation layer 113 to contact the gate insulation layer 113, as shown in FIG. 6.

Figure 7:
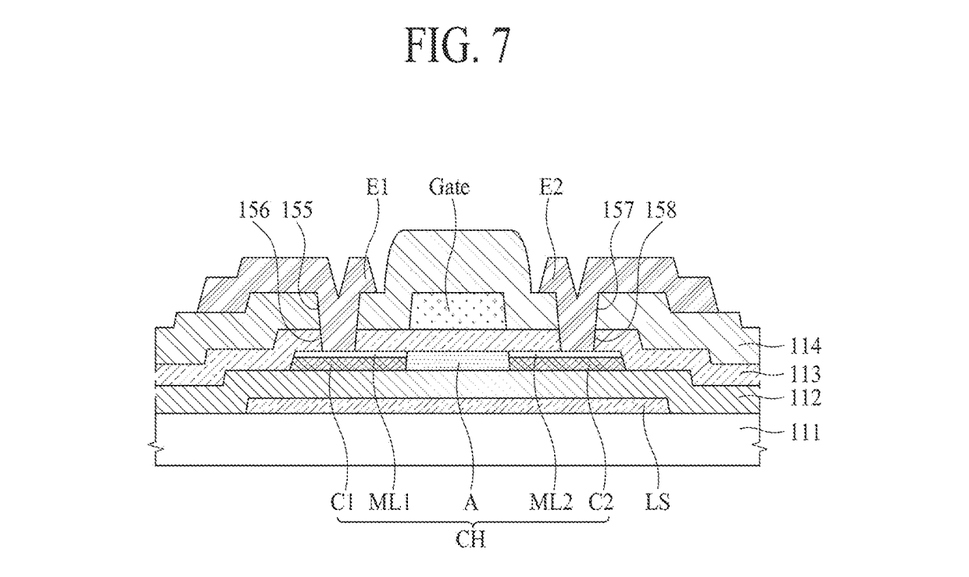
Figure 8:
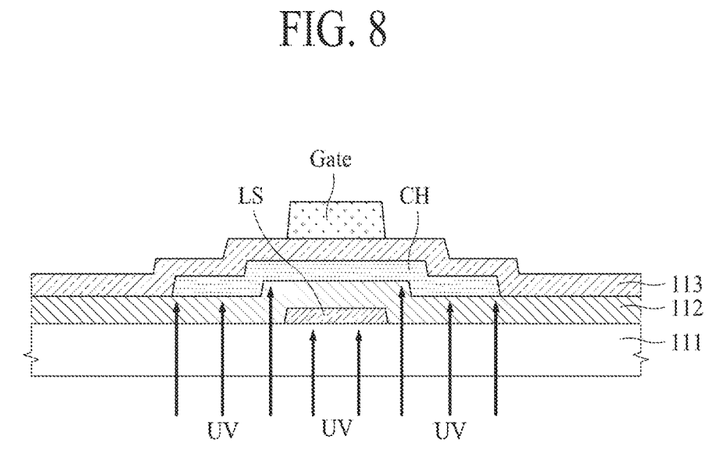
FIG. 8 is an exemplary diagram illustrating another coplanar type oxide TFT applied to an organic light emitting display panel according to an embodiment of the present invention.

Subsequently, as illustrated in FIG. 7, after the first conductor C1 and the second conductor C2 are formed, the passivation layer 114 may cover the gate insulation layer 113 and the gate electrode Gate.

A first contact hole 155 is formed through the passivation layer 114 and a second contact hole 156 is formed through the gate insulation layer 113 to expose at least a portion of the first conductor C1. The first contact hole 155 and the second contact hole 156 may be formed simultaneously. A third contact hole 157 is formed through the passivation layer 114 and a fourth contact hole 158 is formed through the gate insulation layer 113 to expose at least a portion of the second conductor C2. The third contact hole 157 and the fourth contact hole 158 may be formed simultaneously.

The first electrode E1 provided on the gate insulation layer 113 may be connected to the first conductor C1 through the first contact hole 115 formed in the passivation layer 114 and the second contact hole 116 formed in the gate insulation layer 113, and the second electrode E2 provided on the gate insulation layer 113 may be connected to the second conductor C2 through the third contact hole 117 formed in the passivation layer 114 and the fourth contact hole 118 formed in the gate insulation layer 113.

Finally, as illustrated in FIG. 3, the insulation layer 115 may cover the first electrode E1, the second electrode E2, and the passivation layer 114.

Figure 9:
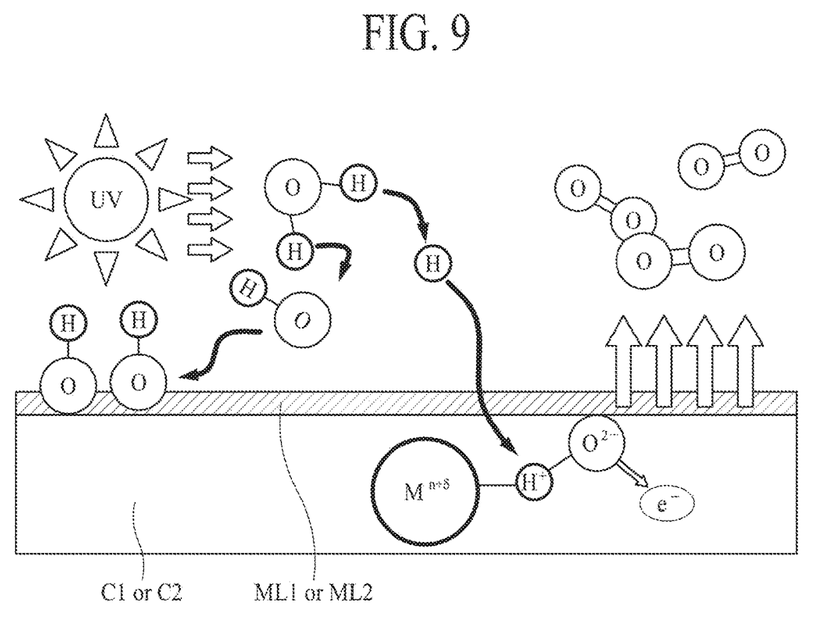
FIG. 9 is an exemplary diagram illustrating a method of forming a first conductor and a second conductor of a coplanar type oxide TFT according to an embodiment of the present disclosure.

FIG. 9 is an exemplary diagram illustrating a method of forming the first conductor C1 and the second conductor C2 of the coplanar type oxide TFT according to an embodiment of the present disclosure.

As described above, when the UV is irradiated onto the semiconductor layer CH consisting of the oxide semiconductor such as IGZO or the like, a bond between oxygen ($O^{2-}$) and metal M constituting the oxide semiconductor may be broken, and the oxygen ($O^{2-}$) may be dissociated from the metal M. In this case, free electrons may be generated due to the oxygen vacancies. Accordingly, the first conductor C1 and the second conductor C2 where the free electrons are generated may be respectively provided at both ends of the semiconductor layer CH. In other words, carriers may be generated in an area of the oxide semiconductor into which the UV is irradiated, and thus, a resistance of the area is rapidly reduced, whereby the area may have characteristics of a conductor.

Oxygen ($O^{2-}$) dissociated from the metal M may bond to each other to generate an oxygen molecule, and the oxygen molecule may be trapped in the gate insulation layer 113 or may be discharged externally through the gate insulation layer 113.

When the UV is irradiated onto the semiconductor layer CH, water ($H_2O$) remaining in the gate insulation layer 113 or water ($H_2O$) in the air may be photo dissociated into an H group and an OH group by the UV irradiation.

The metal M from which the oxygen ($O^{2-}$) is dissociated may bond to the OH group in a boundary area between the first conductor C1 and the gate insulation layer 113 to form the first metal layer ML1, and the metal M from which the oxygen ($O^{2-}$) is dissociated may bond to the OH group in a boundary area between the second conductor C2 and the gate insulation layer 113 to form the second metal layer ML2.

A mobility of the first conductor C1 increases due to the first metal layer ML1 and the free electrons, and thus, a resistance is reduced. A mobility of the second conductor C2 increases due to the second metal layer ML2 and the free electrons, and thus, a resistance is reduced.

In other words, in order to change an oxide semiconductor material to a conducting material, oxygen may be physically dissociated through dry etching and plasma.

However, in the present disclosure, when the oxide semiconductor (for example, IGZO) is changed to $IGZO_{1-x}$ due to oxygen vacancies, the oxide semiconductor may be changed to a conductor.

To this end, in the present disclosure, oxygen may be physically dissociated from the metal in the oxide semiconductor by using the UV rays instead of dry etching and plasma.

For example, due to the UV irradiation, oxygen defects occur in a metal oxide semiconductor such as $IGZO_4$, and thus, the metal oxide semiconductor may be changed to $IGZO_{4-x}$, and oxygen vacancies may supply free electrons. In this case, the vacancy of the oxygen may be bonded to an OH group to form an MOH bond, whereby the vacancy of the oxygen cannot be bonded to oxygen again.

When the energy difference between the conduction band and the valance band may be about 250 lambda when the difference is converted to a wavelength range. Due to a dangling bond state between the conduction band and the valance band, when UV rays having a wavelength of 400 lambda or less is irradiated, oxygen vacancies may be formed due to dissociation of oxygen. Therefore, UV rays having a wavelength of 100 lambda to 400 lambda is appropriate to dissociate the oxygen.

Figure 10:
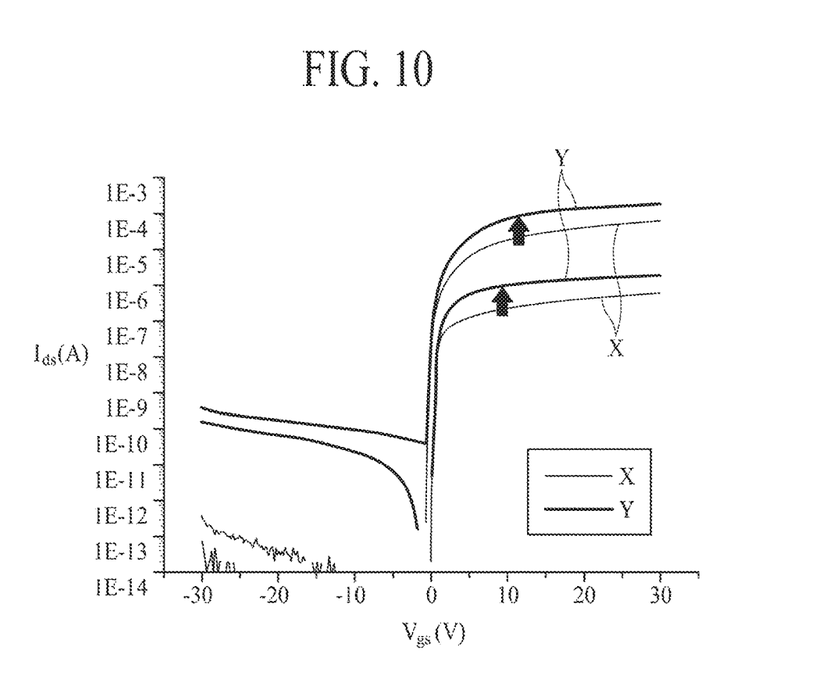
FIG. 10 is a graph showing a result obtained by comparing the device characteristics of a coplanar type oxide TFT according to an embodiment of the present disclosure with the device characteristic of a coplanar type oxide TFT which has a structure similar to an embodiment of the present disclosure but on which ultraviolet (UV) is not irradiated.

FIG. 10 is a graph showing a result obtained by comparing the device characteristic of a coplanar type oxide TFT according to an embodiment of the present disclosure with the device characteristics of a coplanar type oxide TFT which has a structure similar to an embodiment of the present disclosure but on which ultraviolet (UV) is not irradiated. In FIG. 10, reference numeral X refers to characteristic of an oxide semiconductor which is not processed by UV irradiation although the oxide semiconductor has a structure where a gate insulation layer is not etched similarly to an oxide semiconductor according to an embodiment of the present disclosure. Reference numeral Y refers to characteristic of the oxide semiconductor according to an embodiment of the present disclosure which has a structure illustrated in FIG. 3 and has been processed by UV irradiation.

A structure where a gate insulation layer is not etched is good in terms of reducing defects, but if UV treatment is not performed, resistances of both ends of the semiconductor layer increase greatly. Therefore, a very high resistance may be applied between the first electrode E1 and the semiconductor layer, and thus, a current may be cut off. Accordingly, mobility is greatly reduced as shown in the characteristics of the graph referred to by X, and for this reason, it is difficult to use the oxide semiconductor for which the UV treatment is not performed.

However, when the UV treatment is performed as in the present embodiment, the resistance characteristics of the first and second conductors C1 and C2 improve as shown in characteristics of the graph referred to by Y. Therefore, an on current increases in the oxide semiconductor for which the UV treatment has been performed.

In the present embodiment, after the gate electrode Gate is formed on the gate insulation layer 113 through a wet etching process, UV (185 nm+254 nm) may be irradiated onto the gate electrode Gate and the gate insulation layer 113. In this case, thermal processing of 100° C. to 200° C. (for example, heat of 150° C.) may be applied under the substrate 111 simultaneously with the UV irradiation.

Therefore, both ends of the semiconductor layer CH may become conductive, and thus, the first and second conductors C1 and C2 may be formed.

As a simulation and test result, a mobility of the semiconductor layer CH before the both ends of the semiconductor layer CH become conductive is 4.5 $cm^2$/Vs, and a current is cut off by a resistance of the semiconductor layer CH. However, according to an embodiment of the present disclosure, both ends of the semiconductor layer CH become conductive due to UV irradiated thereon, and a mobility of each of the first and second conductors C1 and C2 is enhanced to 15 $cm^2$/Vs. Therefore, it can be seen that the device performance of the oxide semiconductor is enhanced by 300% or more. In this case, when thermal processing is applied to the oxide semiconductor, characteristics of the first and second conductors C1 and C2 are more stabilized. Accordingly, an oxide semiconductor with enhanced reliability is manufactured.

For example, in FIG. 10, the graph referred to by X shows a relationship between a gate-source voltage Vgs and a drain-source current Ids in an oxide semiconductor which has a structure similar to a structure according to an embodiment of the present disclosure but where UV is not irradiated onto both ends of a semiconductor layer, and the graph referred to by Y shows a relationship between a gate-source voltage Vgs and a drain-source current Ids in the oxide semiconductor according to an embodiment of the present disclosure. Referring to FIG. 10, in comparison with the oxide semiconductor which has the structure similar to the structure according to an embodiment of the present disclosure but where the UV is not irradiated onto both ends of the semiconductor layer, it can be seen that the drain-source current Ids in the oxide semiconductor according to an embodiment of the present disclosure increases.

Figure 11:
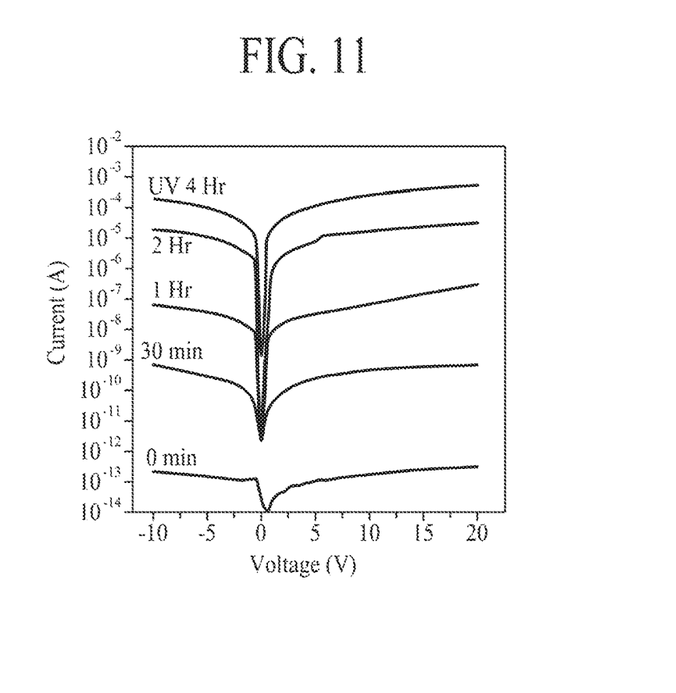
FIG. 11 is a graph showing a relationship between a current and a duration for which UV is irradiated onto a coplanar type oxide TFT according to an embodiment of the present disclosure.
Figure 12:
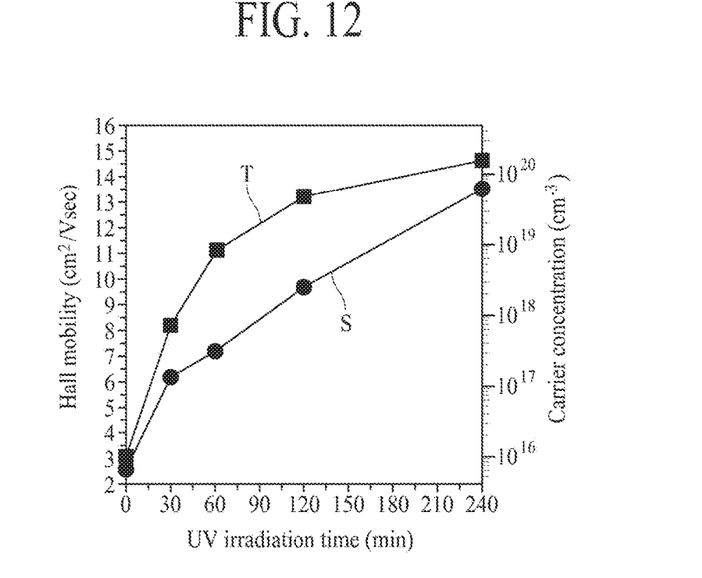
FIG. 12 is a graph showing a relationship between Hall mobility, carrier concentration, and a duration for which UV is irradiated onto a coplanar type oxide TFT according to an embodiment of the present disclosure.

FIG. 11 is a graph showing a relationship between a current and a duration for which UV is irradiated onto a coplanar type oxide TFT according to an embodiment of the present disclosure. FIG. 12 is a graph showing a relationship between Hall mobility, carrier concentration, and a duration for which UV is irradiated onto a coplanar type oxide TFT according to an embodiment of the present disclosure.

First, referring to FIG. 11, as a duration for which UV is irradiated increases, a current flowing in the oxide semiconductor according to an embodiment of the present disclosure increases.

Referring to FIG. 12, as a duration for which UV is irradiated increases, a Hall mobility and a carrier concentration of the oxide semiconductor according to an embodiment of the present disclosure increase. In FIG. 12, a graph showing the hall mobility is referred to by T, and a graph showing the carrier concentration is referred to by S.

Therefore, it can be seen that carriers in the oxide semiconductor increase due to irradiation of UV, and thus, a resistance is reduced.

The above-described features of the present disclosure will be briefly summarized below.

According to an embodiment of the present disclosure, the resistance characteristic of an oxide semiconductor is controlled by a photo-chemical method without vacuum dry etching (D/E) equipment.

Therefore, according to an embodiment of the present disclosure, merits of the related art coplanar type oxide TFT may be retained, a process of manufacturing a coplanar type oxide TFT is simplified, the device characteristic of the coplanar type oxide TFT is improved, and a defect issue is reduced.

For example, in the related art, a short circuit between a gate and a drain can occur due to a foreign material introduced when etching the gate insulation layer. However, according to the embodiments of the present disclosure, since the gate insulation layer is not etched, a possibility that a short circuit is created between a gate and a drain is reduced.

Moreover, in the embodiments of the present disclosure, the gate insulation layer is not etched, thereby preventing a short circuit defect which occurs between the light shielding layer and conductive lines because the buffer is etched when etching the gate insulation layer.

In the related art, the gate insulation layer is etched, and then, end portions of a semiconductor layer formed of oxide semiconductor become conductive by using plasma, thereby manufacturing the coplanar type oxide TFT.

On the other hand, in the coplanar type oxide TFT according to the embodiments of the present disclosure, the gate insulation layer may not be etched. According to the embodiments of the present disclosure, by applying UV irradiation (185 nm+254 nm) and thermal processing (150° C.) to the end portions of the semiconductor layer covered by the gate insulation layer, the end portions of the semiconductor layer may become conductive, thereby manufacturing the coplanar type TFT.

To provide an additional description, in the embodiments of the present disclosure, a process of etching the gate insulation layer may be omitted, and the end portions of the semiconductor layer formed of oxide (IGZO) may become conductive by using the photo-chemical method, thereby manufacturing the coplanar type TFT.

In the embodiments of the present disclosure, since the process of etching the gate insulation layer is omitted, a process is simplified, and since there is no step height of the gate insulation layer, an error rate is reduced in subsequent processes.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An oxide thin film transistor (TFT) comprising:
a first substrate;
a light shielding layer provided on the first substrate;
a buffer provided on the light shielding layer;
a semiconductor layer provided on the buffer, the semiconductor layer including an oxide semiconductor material and comprising an active area, a first conductor adjacent to a first end of the active area, and a second conductor adjacent to a second end of the active area;
a gate insulation layer covering the semiconductor layer and the buffer;
a gate electrode provided on the gate insulation layer and overlapping a portion of the semiconductor layer; and
a passivation layer covering the gate electrode and the gate insulation layer,
wherein a resistance of the active area is different from a resistance of the first conductor and a resistance of the second conductor,
wherein a width of the active area is substantially the same as a width of the light shielding layer, and wherein the light shielding layer does not receive a gate pulse for turning on the oxide TFT, and
wherein the gate electrode is electrically connected to a gate line of a display device, and wherein the light shielding layer is electrically isolated from the gate line.

2. The oxide TFT of claim 1, wherein the active area is aligned with the gate electrode.

3. The oxide TFT of claim 1, wherein a portion of the buffer covering an end of the light shielding layer has an inclined surface, and wherein the gate insulation layer covers the portion of the buffer.

4. The oxide TFT of claim 1, wherein the resistance of the first conductor is lower than the resistance of the active area, and the resistance of the second conductor is lower than the resistance of the active area.

5. The oxide TFT of claim 1, wherein:
the first conductor comprises a same metal that is included in the oxide semiconductor material, and the metal included in the first conductor comprises a free electron and an oxygen vacancy, and
the second conductor comprises the same metal as the first conductor, and the metal in the second conductor comprises a free electron and an oxygen vacancy.

6. The oxide TFT of claim 1, wherein:
the first conductor comprises a first metal layer contacting the gate insulation layer, wherein the first metal layer comprises a same metal that is included in the oxide semiconductor material bonded to a hydroxy group (—OH), and
the second conductor comprises a second metal layer contacting the gate insulation layer, wherein the second metal layer comprises the metal bonded to a hydroxy group (—OH).

7. The oxide TFT of claim 1, further comprising:
a first electrode of the oxide TFT contacting the first conductor through a first contact hole in the gate insulation layer and a second contact hole in the passivation layer, wherein the first contact hole and the second contact hole are aligned; and
a second electrode of the oxide TFT contacting the second conductor through a third contact hole in the gate insulation layer and a fourth contact hole in the passivation layer, wherein the third contact hole and the fourth contact hole are aligned.

8. The oxide TFT of claim 1, wherein a number of oxygen vacancies in the first conductor is greater than a number of oxygen vacancies in the active area, and a number of oxygen vacancies in the second conductor is greater than the number of oxygen vacancies in the active area.

9. A display panel comprising:
a plurality of gate lines that receive a plurality of gate pulses;
a plurality of data lines that receive a plurality of data voltages; and
a plurality of pixels defined by the plurality of gate lines and the plurality of data lines, wherein each of the plurality of pixels comprises an oxide thin film transistor (TFT) comprising:
a light shielding layer;
a buffer provided on the light shielding layer;
a semiconductor layer provided on the buffer, the semiconductor layer including an oxide semiconductor material and comprising an active area, a first conductor adjacent to a first end of the active area, and a second conductor adjacent to a second end of the active area;
a gate insulation layer covering the semiconductor layer and the buffer;
a gate electrode provided on the gate insulation layer and overlapping a portion of the semiconductor layer; and
a passivation layer covering the gate electrode and the gate insulation layer,
wherein a resistance of the active area is different from a resistance of the first conductor and a resistance of the second conductor,
wherein a width of the active area is substantially the same as a width of the light shielding layer, and wherein the light shielding layer does not receive a gate pulse from the plurality of gate lines for turning on the oxide TFT, and
wherein the gate electrode is electrically connected to a corresponding gate line in the plurality of gate lines, and wherein the light shielding layer is electrically isolated from the plurality of gate lines.

10. The display panel of claim 9, wherein the active area is aligned with the gate electrode.

11. The display panel of claim 9, wherein a portion of the buffer covering an end of the light shielding layer has an inclined surface, and wherein the gate insulation layer covers the portion of the buffer.

12. The display panel of claim 9, wherein the oxide TFT is provided in a non-display area outside a display area where the plurality of pixels are provided.

13. A method of manufacturing an oxide thin film transistor (TFT), the method comprising:
forming a light shielding layer on a substrate;
depositing a buffer on the substrate;
forming a semiconductor layer including an oxide semiconductor material on the buffer;
depositing a gate insulation layer that covers the semiconductor layer and the buffer;
depositing a gate electrode overlapping the semiconductor layer;
decreasing a resistance of a first area and a second area of the semiconductor layer, the first area at a first end of an active area of the semiconductor layer and the second area at a second end of the active area of the semiconductor layer, the first area with the decreased resistance forming a first conductor and the second area with the decreased resistance forming a second conductor while the gate insulation layer is covering the semiconductor layer and the buffer,
wherein decreasing the resistance of the first area and the second area comprises irradiating ultraviolet (UV) light on the semiconductor layer, the UV light being irradiated from below the substrate.

14. The method of claim 13, wherein responsive to the UV light being irradiated on the gate electrode, the active area is aligned with the gate electrode.

15. The method of claim 13, wherein a width of the active area is aligned with a width of the light shielding layer.

16. The method of claim 13, further comprising thermally processing the semiconductor layer simultaneously with the irradiating of the UV or after the irradiating of the UV.

17. The method of claim 13, further comprising:
depositing a passivation layer that covers the gate insulation layer and the gate electrode;
simultaneously forming a first contact hole and a second contact hole respectively through the passivation layer and the gate insulation layer, and a third contact hole and a fourth contact hole respectively through the passivation layer and the gate insulation layer, wherein the first contact hole and the second contact hole are aligned, and wherein the third contact hole and the fourth contact hole are aligned; and
forming a first electrode of the oxide TFT contacting the first conductor through the first contact hole and the second contact hole, and forming a second electrode of the oxide TFT contacting the second conductor through the third contact hole and the fourth contact hole.

* * * * *